July 31, 1951 H. GOLDBERG 2,562,311

FREQUENCY CONVERTER COMPRISING PIEZOELECTRIC CRYSTAL STABILIZATION

Filed April 18, 1947

Inventor

HAROLD GOLDBERG

By Robert T. Killman

Attorney

Patented July 31, 1951 2,562,311

UNITED STATES PATENT OFFICE 2,562,311

FREQUENCY CONVERTER COMPRISING PIEZOELECTRIC CRYSTAL STABILIZATION

Harold Goldberg, Towson, Md., assignor to Bendix Aviation Corporation, Towson, Md., a corporation of Delaware Application April 18, 1947, Serial No. 742,418

3 Claims. (Cl. 250—20)

Figures 1, 2, 3:
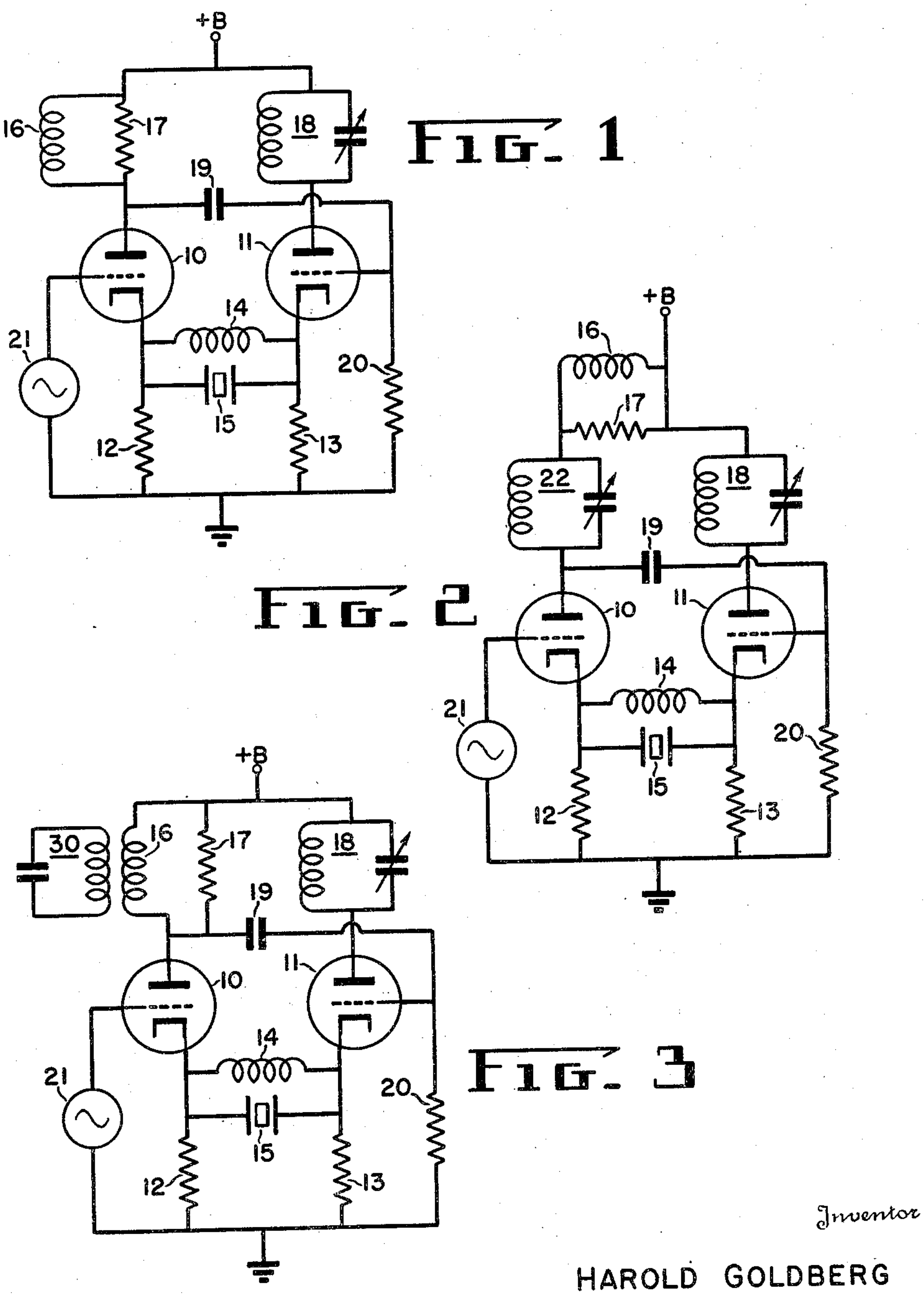

This invention is directed to superheterodyne receivers. More specifically it is directed to frequency converters or first detectors in superheterodyne receivers.

A superheterodyne converter comprises the vacuum tube or tubes in a superheterodyne receiver which are placed between the signal frequency, or R. F. circuits, and the intermediate frequency, or I. F. circuits. It usually comprises a high frequency oscillator whereby there is generated a local oscillation differing from the R. F. frequency by an amount equal to the I. F. frequency, and a socalled first detector which is in its simplest form a non linear element wherein the R. F. and oscillator signals are combined to form a series of "beat" frequencies, one of which is the desired I. F. signal.

In some converters the oscillator operates at a submultiple of the desired beating frequency, and this is usually referred to as harmonic injection. Such a procedure is often used for stability reasons when the required beating frequency is high. One or more harmonic amplifiers is often used between the oscillator and the first detector when it is desired to increase the amplitude of the beating locally-generated signal.

Many complications arise in the design and construction of this latter arrangement when it is desired that the converter effectively handle a wide frequency range of R. F. signals because of the necessity of simultaneously varying the frequencies of the oscillator, the harmonic generators, and the detector circuit, and therefore it is most commonly found in fixed-frequency units wherein the various circuits may be individually tuned to the required frequencies once and for all.

A crystal-controlled oscillator, operating at a comparatively low frequency, followed by several harmonic amplifiers or multipliers is frequently used in such receivers. It will be manifest that such an arrangement, requiring several vacuum tube amplifiers and tuned circuits, is complex, and has myriad potentialities as a trouble source.

It is an object of this invention to provide a simple crystal-controlled converter for a high frequency superheterodyne wherein a comparatively low frequency crystal can be used.

This object is accomplished in the instant invention by using a crystal-controlled cathode-coupled oscillator as oscillator, harmonic amplifiers, and detector, all in two vacuum tubes. Alternatively a single vacuum tube including two sets of elements may be used.

The above and further objects and novel features will more fully appear from the following detailed description when the same is read in connection with the accompanying drawings. It is to be expressly understood, however, that the drawings are for purposes of illustration only, and are not intended as a definition of the limits of the invention, reference for this purpose being had to the appended claims.

In the drawings, wherein like reference characters refer to like parts throughout the several views, Fig. 1 is a schematic circuit diagram of a converter in accordance with the instant invention, and Figs. 2 and 3 are alternative embodiments of the instant invention.

Referring now to Fig. 1, there is illustrated a pair of vacuum tubes 10 and 11, the cathodes of which are connected to ground through resistors 12 and 13 respectively. The cathodes are connected together through an inductor 14 which is shunted by a piezoelectric crystal 15. The anode of the tube 10 is connected to a source of voltage +B through an inductor 16 which is shunted by a resistor 17. The anode of the tube 11 is connected to the source +B through a parallel resonant LC circuit 18. The anode of the tube 10 is connected through a condenser 19 to the control electrode of the tube 11, which control electrode is connected to ground through a resistor 20.

In operation the inductor 16 in conjunction with the distributed circuit capacitances is broadly resonant to the oscillator frequency $f_o$. Broadness is attained by the use of the damping resistor 17. The crystal 15, which has a fundamental series mode of oscillation at a frequency $f_o/n$ is shunted by the inductor 14 which has proper inductance to anti-resonate the capacitance of the crystal holder at the frequency $f_o$.

The resonant circuit 18 is tuned to the I. F. frequency $f_i$, and a source 21 of R. F. signals at frequency $f_r$ is connected between the control electrode of the tube 10 and ground.

In operation the tubes 10 and 11 operate as a cathode coupled oscillator at a frequency $f_o$, a harmonic of the crystal frequency $f_o/n$, and that oscillator signal is beat with the signal of frequency $f_r$ which is applied by the source 21. An output signal of frequency $f_i$ is generated in the circuit 18 wherein $f_i=f_r-f_o$ or $f_i=f_o-f_r$.

In the case where the frequencies $f_o$ and $f_r$ differ by too great an amount to be accommodated by the pass band of the circuit comprising the inductor 16 and the distributed circuit capacitances the anode circuit of the tube 10 may be made to have a double resonant peak by the means shown in Figs. 2 and 3.

In Fig. 2 there is illustrated a parallel resonant circuit 22 connected between the anode of the tube 10 and the inductor 16 for this latter purpose, and in Fig. 3 there is illustrated a parallel resonant circuit 30 coupled to the inductor 16 for the same purpose.

Since output signals at the I. F. frequency $f_i$ are present in each case in the circuit 18, they may be removed and conducted to the I. F. amplifier by any conventional means, such as inductive coupling to the inductor comprising the circuit 18 or through capacitive coupling by a condenser connected to the anode of the tube 11.

What is claimed is:

1. A heterodyne circuit comprising two electron discharge tubes each having an anode, a cathode and a control grid, means for coupling the anode of the first of said tubes to the control grid of the second, means for coupling the cathode of said second tube to the cathode of said first tube through a piezoelectric crystal, whereby a local oscillation is produced, a source of radio frequency energy, means for coupling said source of radio frequency energy between the cathode and grid of said first tube, said coupling means between said anode of said first tube and said control grid of said second tube being resonant to both said local oscillations and said radio frequency source, and means for coupling the anode of said second tube to an output means.

2. A heterodyne circuit as set forth in claim 1 wherein said coupling means between said anode of said first tube and said control grid of said second tube is broadly resonant to both said local oscillations and said radio frequency source.

3. A heterodyne circuit as set forth in claim 1 wherein said coupling means between said anode of said first tube and said control grid of said second tube is sharply resonant to said local oscillations and to said radio frequency source.

HAROLD GOLDBERG.

REFERENCES CITED

The following references are of record in the file of this patent:

UNITED STATES PATENTS

| Number | Name | Date |
|---|---|---|
| 2,031,100 | Engel | Feb. 18, 1936 |
| 2,059,587 | Klotz et al. | Nov. 3, 1936 |
| 2,137,687 | Hansell | Nov. 22, 1938 |
| 2,246,935 | Feldtkeller | June 24, 1941 |
| 2,432,183 | Van Slooten | Dec. 9, 1947 |
| 2,455,510 | Ludwig | Dec. 7, 1948 |

FOREIGN PATENTS

| Number | Country | Date |
|---|---|---|
| 197,405 | Great Britain | May 11, 1923 |
| 705,431 | France | Mar. 9, 1931 |

OTHER REFERENCES

Wireless Engineer, Nov. 1944, pp. 521–528.